United States Patent

Suda et al.

[11] Patent Number: 5,857,840
[45] Date of Patent: Jan. 12, 1999

[54] VACUUM PUMP WITH A CENTRIFUGAL DUST COLLECTOR AND A METAL MESH DUST COLLECTOR MOUNTED IN PARALLEL

[75] Inventors: Ayumi Suda, Chigasaki; Yoshinobu Hiraishi, Omura, both of Japan

[73] Assignee: Komatsu Electronic Metals Co., Ltd., Hiratsuka, Japan

[21] Appl. No.: 706,492

[22] Filed: Sep. 4, 1996

[51] Int. Cl.$^6$ ............................. F04B 39/16; F04B 49/00
[52] U.S. Cl. ......................... 417/302; 417/313; 34/92; 34/406; 55/484
[58] Field of Search ............................. 417/313, 302, 417/298; 34/92, 406; 55/484

[56] References Cited

U.S. PATENT DOCUMENTS

| | | | |
|---|---|---|---|
| 5,019,257 | 5/1991 | Suzuki et al. | 210/253 |
| 5,062,771 | 11/1991 | Satou et al. | 417/201 |
| 5,069,691 | 12/1991 | Travis et al. | 55/126 |
| 5,129,124 | 7/1992 | Gamou et al. | 15/352 |
| 5,137,554 | 8/1992 | Carter, Jr. | 55/399 |
| 5,223,001 | 6/1993 | Saeki | 29/25.01 |
| 5,272,866 | 12/1993 | Niemen | 60/39.02 |

Primary Examiner—Timothy Thorpe
Assistant Examiner—Ehud Gartenberg
Attorney, Agent, or Firm—Varndell Legal Group

[57] ABSTRACT

The objects of the present invention are to remove the dust in a closed container, to keep the pressure in the closed container within a predetermined range, and to shorten the maintenance time of a vacuum pump system.

The present invention provides a centrifugal dust collector 2 on main pipes which connects a furnace body 1, a mechanical press 9 and a dry pump 10, and a metal mesh dust collector 15 on a bifurcated pipe in a single-crystal semiconductor pulling apparatus. When the vacuum pump process begins, the metal mesh dust collector 15 collects amorphous silicon generated in the furnace 1. As the pressure in the furnace is reduced, the centrifugal dust collector 2 collects the dust particles instead. Since the gas flow rate increases as the vacuum state become higher, the critical diameter of collectable particles decreases, thereby improving the dust collection efficiency. The collected amorphous silicon accumulates on the bottom of the centrifugal dust collector and can be easily removed so as to facilitate maintenance. Moreover, there will be very little pressure variance in the furnace since no dust filter is blocked.

6 Claims, 5 Drawing Sheets

VACUUM PUMP WITH A CENTRIFUGAL DUST COLLECTOR AND A METAL MESH DUST COLLECTOR MOUNTED IN PARALLEL

BACKGROUND OF THE INVENTION

1. Field of the Invention

The present invention relates to a vacuum pump system for providing a vacuum state, and more specifically, to a vacuum pump system which can collect and absorb airborne dust.

2. Description of the Related Art

Various vacuum pump systems have been utilized to keep a closed container a in low or medium vacuum state. When the gas extracted from the closed container contains dust particles, a dust filter which can collect the dust particles is provided in the way between the closed container and the vacuum pump to maintain the performance of the vacuum pump, therefore, only pure gas will be absorbed in the vacuum pump.

FIG. 6 illustrates the configuration of a vacuum pump system for a single-crystal semiconductor pulling apparatus. The substrate material of a semiconductor device consists of single-crystal silicon of high purity. The single-crystal silicon can be fabricated by methods such as the CZ method. The CZ method includes filling a quartz crucible with polycrystal material, heating the polycrystal material to the melting point by heaters located around the quartz crucible, immersing in the melt a seed which is fixed on a seed holder, and pulling up the seed holder to form the single-crystal material. When the polycrystal material is melted, the melt will react with the crucible made of quartz to generate $SiO_x$. The amorphous $SiO_x$ (amorphous silicon) will gather or adhere on the wall surface, the surface of the pulled single-crystal material, or the wall surface of the furnace. This substance, if melted into the as-grown single-crystal material, will change the phase of the single-crystal material, thus affecting the fabrication efficiency. In order to solve this problem, high purity inner gas is introduced above the semiconductor pulling apparatus to bring the amorphous silicon away, and then is expelled out through the bottom or lower portion of the furnace.

In the aforementioned semiconductor pulling apparatus, the inner gas can be absorbed by a vacuum pump system using mechanical press and oil pressure pump, thus keeping the pressure inside the furnace in a low or medium vacuum state. However, if the amorphous silicon adheres to the rotator of mechanical press, the rotator will be blocked as a result of the narrow spacing (about 0.1 to 0.5 mm) between the rotator and its cover. Moreover, the lubricant in the oil pressure pump will have a higher viscosity if mixed with the amorphous silicon. Therefore, the pump cannot operate normally and may even stop pumping.

The arrangement illustrated in FIG. 6 is provided for preventing the aforementioned problem in the vacuum pump system used in the conventional semiconductor pulling apparatus. That is, a dust filter 21 consisting of a number of metal meshes is provided in the midway of a pipe 20 which connects the semiconductor pulling apparatus 1 and the vacuum pump. The harmful amorphous silicon can be collected by the filter 21, and then the inner gas is absorbed by the mechanical press 9 and the oil pressure pump 22. As shown in the figure, element 4 is a manual valve, element 5 is an emergency auto valve, element 6 is a bellows expansion joint, element 7 is an auto valve, and element 23 is a oil gas collector.

Nonetheless, in order to remove the dust particles completely, the mesh sizes of the dust filter 21 must be as small as possible, thus increasing the pressure difference between opposite sides of the filter. This problem can be solved by improving the pumping ability of the vacuum pump or increasing the effective area of the dust filter. However, the two solutions will increase the apparatus dimensions and manufacturing cost.

Furthermore, the amorphous silicon will keep accumulating on the dust filter as the semiconductor is continuously pulled. Therefore, the pressure difference between opposite sides of the filter increases during the semiconductor pulling process. Since the furnace pressure in the beginning of a pulling process is much lower than that at the end of the process, the quality of the single-crystal varies from its top portion to the end portion. In order to prevent an increase in the furnace pressure, the dust filter must be changed or cleaned whenever a pulling process has been done. This additional maintenance task wastes a lot of time.

SUMMARY OF THE INVENTION

Accordingly, the present invention provides a vacuum pump system and a method for controlling the same to remove the dust particles in a pipe between a closed container and a vacuum pump, thereby keeping the pressure in the closed container within a predetermined range and reducing the time required to maintain the vacuum pump system.

The present invention is characterize by a vacuum pump system for making a closed container vacuous, comprising a vacuum pump and a centrifugal dust collector provided on a pipe connecting the closed container and the vacuum pump.

The vacuum pump system comprises:
- a main pipe having a first main pipe which connects the closed container and the centrifugal dust collector and a second main pipe which connects the centrifugal dust collector and the vacuum pump;
- a bifurcated pipe which is branched out from the first main pipe and connected to the vacuum pump;
- a metal mesh dust collector disposed on the bifurcated pipe; and
- pipe switching means for switching over between the main pipe and the bifurcated pipe.

The pipe switching means comprises measuring means for measuring a vacuum of the closed container, and wherein the pipe switching means switches over in such a manner that the bifurcated pipe is connected with the vacuum pump until the vacuum of the closed container reaches a predetermined value and the main pipe is connected with the vacuum pump after the vacuum of the closed container has reached the predetermined value.

The measuring means comprises a vacuum meter having a contact disposed in the closed container, and wherein the pipe switching means further comprises auto valves disposed on the first main pipe at a downstream side of the bifurcated pipe, or on the first main pipe and the bifurcated pipe, respectively, and a control device which outputs a command signal to the auto valves in response to an output signal of the vacuum meter.

The closed container constitutes a single crystal pulling apparatus and the centrifugal dust collector is adopted to collect amorphous silicon discharged from the closed container.

Further, the present invention is characterized by a method of making a closed container vacuous, comprising:

a first step of making the closed container vacuous through a metal mesh dust collector until a vacuum of the closed container reaches a predetermined value; and a second step of making the closed container vacuous through a centrifugal dust collector so as to form a high vacuum in the closed container whose vacuum has reached the predetermined value.

The method is employed in a vacuum exhausting system comprising:

a main pipe including a first main pipe connecting the closed container to be made vacuous and a centrifugal dust collector, and a second main pipe connecting the centrifugal dust collector and a vacuum pump;

a bifurcated pipe branched out from the first main pipe and connected to the vacuum pump; and first and second valves disposed on the first main pipe at a downstream side of the bifurcated pipe, or on the first main pipe and the bifurcated pipe, respectively, and wherein the first step is a step of making the closed container vacuous through the metal mesh dust collector under such a condition that the first main pipe is closed and the second main pipe is opened until a value indicated by the vacuum meter having the contact and disposed in the closed container reaches about 100–200 Torr, and the second step is a step of making the closed container vacuous through the centrifugal dust collector under such a condition that the first main pipe is opened and the second main pipe is closed when the value indicated by the vacuum meter having the contact and disposed in the closed container becomes lower than 100–200 Torr.

According to the aforementioned configuration, the centrifugal dust collector is provided on the pipe between the closed container and the vacuum pump to keep the closed container in a low or medium vacuum state. In other words, the centrifugal dust collector is provided on the main pipe, and the metal mesh dust collector is provided on the bifurcated pipe. The pipe routes are switched by controlling the auto valves. For example, in the vacuum pump system of a single crystal semiconductor pulling apparatus, during the period from when the vacuum pump begins to operate to when the pressure is reduced to about 100–200 Torr, the metal mesh dust collector is active to absorb the dust particles. As the pressure continuously decreases, the centrifugal dust collector takes over when the pressure is lower than 100–200 Torr. Then the inner gas containing amorphous silicon whirls in the centrifugal dust collector. When the whirling diameter of the inner gas is equal to or smaller than the diameter of the expelling portion of the dust collector, the inner gas will be expelled out of the collector. The amorphous silicon can then be separated from the inner gas and fall into a dust accumulating area. Therefore, the amorphous silicon contained in the inner gas can be removed to prevent dust filter blockage, thereby keeping the pressure in the container within a predetermined range. Moreover, since the amorphous silicon particles fall into the dust accumulating area, they can be easily removed to facilitate the maintenance.

The aforementioned centrifugal dust collector is usually utilized under atomspheric pressure. Since it is difficult to increase the flow rate in the conducting entrance portion, few of small particles and particles of low concentration can be readily removed. However, in the vacuum pump system of the present invention, the gas in the conducting entrance portion can be accelerated in inverse proportion to the pressure, thus improving the efficiency of dust removal. This can be theoretically explained as follows. The critical diameter of a collectable particle can be represented as Eq. 1.

$$d_p = \left[ \frac{\eta_t \times K}{(\rho_p - \rho_t) \times U_t} \right]^{1/2} \quad (1)$$

wherein K is a shape index of the centrifugal dust collector, $\eta_t$ is adhesive coefficient of the gas, $\rho_p$ is the density of the solid (particles), $\rho_t$ is the density of the gas, and $U_t$ is the flow rate in the conducting entrance portion.

In Eq. 1, the value of K depends on the shape of the centrifugal dust collector. The adhesive coefficient $\eta_t$ and the solid density $\rho_p$ are pressure independent. However, the gas density $\rho_t$ and the flow rate $U_t$ vary a lot as the pressure changes. Since $\rho_t$ is negligible as compared with $\rho_p$, the critical diameter $d_p$ of the collectable particles is determined by $U_t$. The value of $U_t$ can be obtained from the following equation.

$$U_t = \frac{Q_t}{P_t} \times K'$$

In the equation, K' is the shape index of the conducting portion, $Q_t$ is the amount of the gas flow, and $\rho_t$ is the vacuum pressure. Therefore, the flow rate $U_t$ increases as the vacuum pressure $P_t$ decreases. In general, since the pressure in the single-crystal semiconductor pulling apparatus is about 1–30 mbar, and the atmospheric pressure is 1013 mbar, the flow rate in the apparatus is about 30–1000 times higher than that of the atmosphere.

FIG. 5 illustrates the relationships between the pressure and flow rate and between the pressure and diameters of collected particles. Referring to FIG. 5, the flow rate in the vacuum state of the centrifugal dust collector is faster than that at normal atmospheric pressure. Therefore, the diameter of collectable particles can be smaller so that the efficiency of dust collection is improved. Moreover, the centrifugal dust collector has a simple structure and less pressure loss as compared with other dust collectors.

Furthermore, according to the control method of the vacuum pump system of the present invention, the pressure in the closed container is detected by a vacuum meter which is provided with a connector. As the pressure changes, the system switches from the metal mesh dust collector to the centrifugal dust collector to remove the dust particles. Accordingly, in the beginning, i.e., when the flow rate is lower, the dust particles are removed by the metal mesh dust collector. When the vacuum state is high enough, the dust particles are removed by the centrifugal dust collector, instead. Therefore, the dust particles can be efficiently collected due to the advantages of the centrifugal dust collector. Moreover, the switching between the dust collectors is automatically controlled by the auto valves on the main pipes and bifurcated pipe without manual operation.

DETAILED DESCRIPTION OF THE INVENTION

Figure 1:
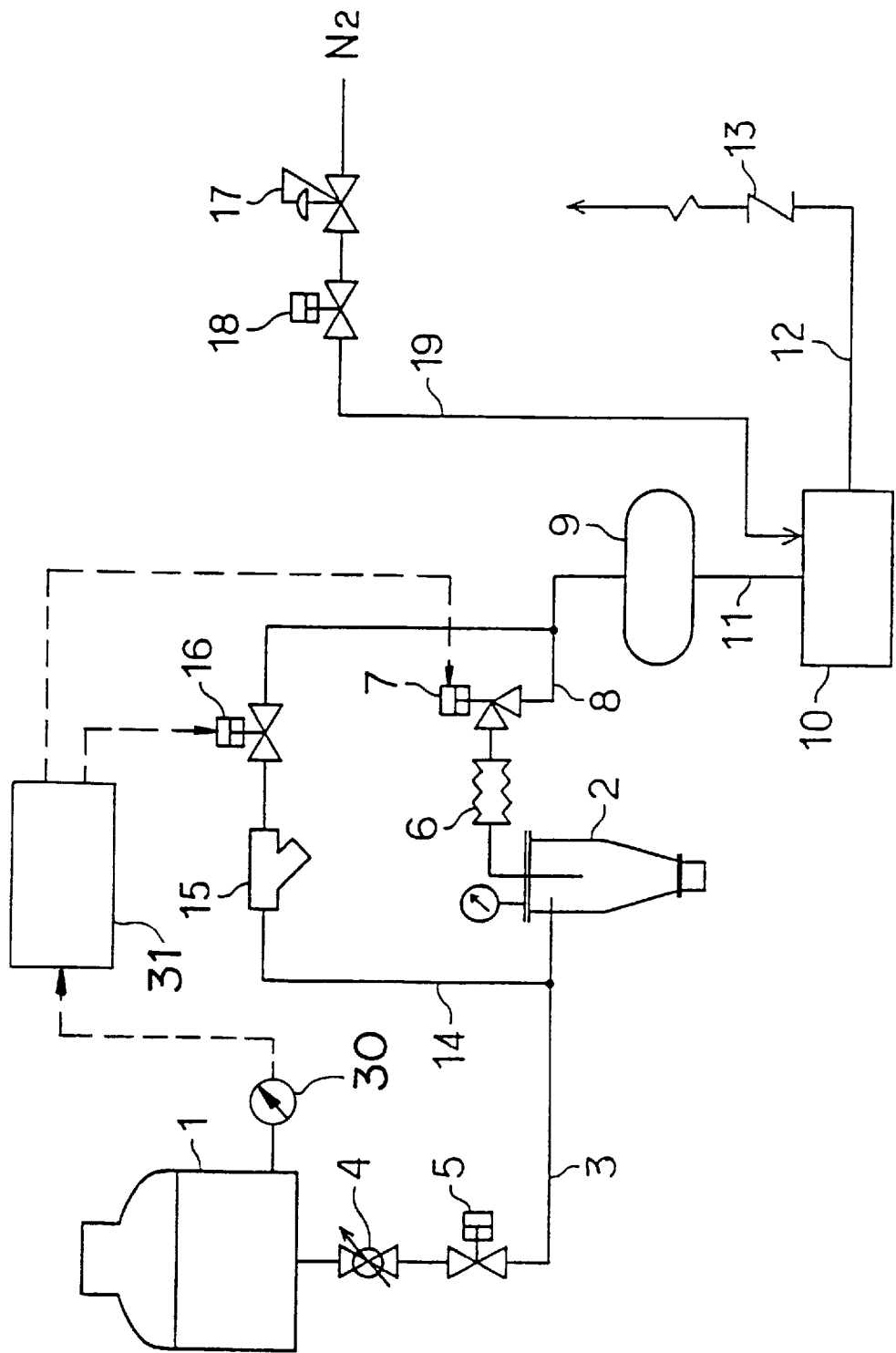
FIG. 1 illustrates the pipe configuration of a vacuum pump system according to the present invention for utilizing in a single-crystal semiconductor pulling apparatus.

Referring to FIG. 1 in which the pipe configuration of the vacuum pump system for a single-crystal semiconductor pulling apparatus is illustrated, the bottom of a furnace body 1 of the single-crystal semiconductor pulling apparatus is connected to a centrifugal dust collector 2 through a first main pipe 3. A manual valve 4 and an emergency auto valve 5 are provided on the first main pipe 3. The centrifugal dust collector 2 is connected to mechanical press 9 through a bellows expansion joint 6, an auto valve 7, and a second main pipe 8. The mechanical press 9 and a dry pump 10 is connected by a pipe 11. A pipe 12 connected to the dry pump 10 can expel gas to the air through a valve 13. The dry pump 10 can be replaced by an oil pressure pump.

A bifurcated pipe 14 is connected to the first main pipe 3 before the centrifugal dust collector 2. The bifurcated pipe 14 is connected to the second main pipe 8 through a metal mesh dust collector 15 and an auto valve 16. Moreover, the dry pump 10 is connected to an $N_2$ supplying pipe through a diaphragm-type booster valve 17 and an auto valve 18.

A vacuum meter 30 which is provided with a connector is connected to the furnace body 1 for detection of the furnace pressure. A control means 31 receives output signals of the vacuum meter (as shown by a dashed line) to generate instructions which are outputted (as shown by dashed line) to control the auto valves 7 and 16.

Figure 2:
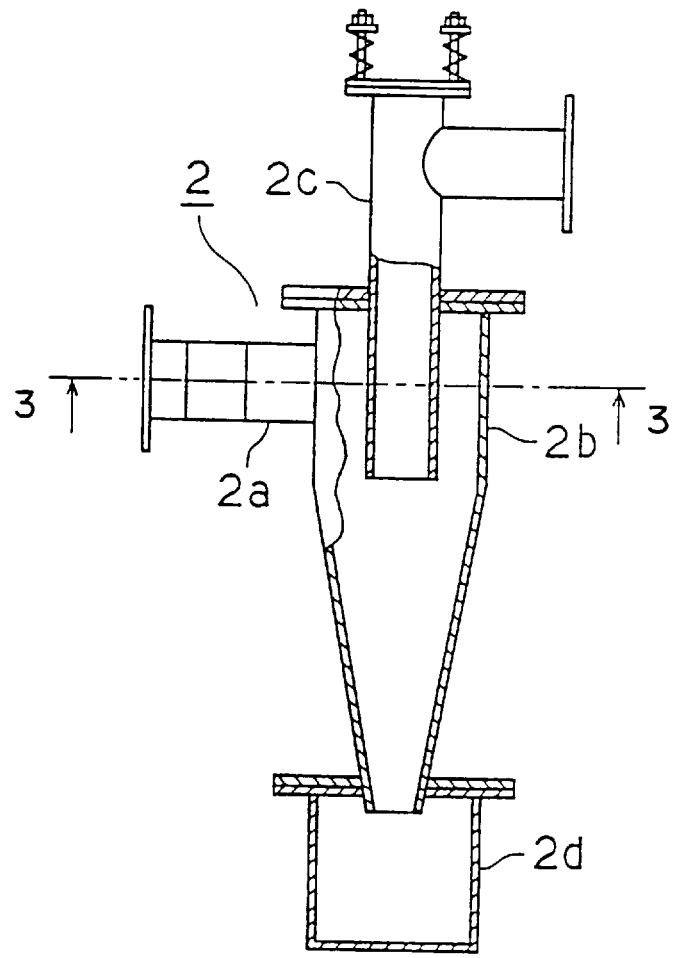
FIG. 2 is a schematic diagram illustrating the structure of a centrifugal dust collector.
Figure 3:
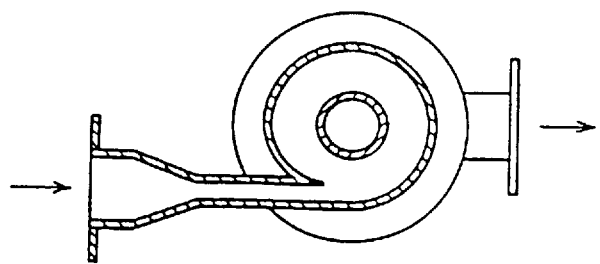
FIG. 3 is a cross-sectional view along the line 3-3 of FIG. 2.

FIG. 2 is a schematic diagram illustrating the structure of the centrifugal dust collector, and FIG. 3 is its cross-sectional view along the line A—A of FIG. 2. The conducting portion 2a of the centrifugal dust collector 2 is located in the tangential direction of the tube portion 2b, and expelling portion 2c is inserted into the upper portion of the tube portion 2b. The lower portion of the tube portion 2b tapers as a cone. A dust accumulating portion 2d is connected to the bottom of the tube portion 2b.

The inner gas which contains amorphous silicon is absorbed from the furnace body 1 into the tube portion 2b of the centrifugal dust collector through the conducting portion 2a, and then whirls downwards along the wall of the tube portion 2b. When the whirling diameter of the inner gas is smaller than the diameter of the expelling portion 2c, it will be expelled through the expelling portion 2c. However, the amorphous silicon particles are separated from the inner gas due to their weight so as to fall into the dust accumulating portion 2d and are accumulated.

The control method of the vacuum pump system of the present invention will be described as follows. The control means 31 is turned on at first to start the vacuum pumping in the furnace body 1. The control means opens the auto valve 16 and closes the auto valve 7 according the output signals of the vacuum meter provided in the furnace body 1. Then the mechanical press 9 and the dry pump 10 are active, and the manual valve 4 is opened. The mechanical press 9 and the dry pump 10 drive the inner gas in the furnace body 1 to flow in the first main pipe 3, the bifurcated pipe 14, and the second main pipe 8. After the vacuum pumping, the pressure in the furnace body is reduced to about 100–200 Torr, and the dust particles expelled with the inner gas are collected by metal mesh dust collector 15. When the pressure in the furnace body is reduced continuously and is lower than 100–200 Torr, the control means closes the auto valve 16 and opens the auto valve 7 to collect the dust particles by the centrifugal dust collector 2. At that time, the flow rate of the inner gas flowing into the centrifugal dust collector 2 is about 3.8–7.6 times higher than the flow rate of normal atmosphere. Moreover, as the pressure in the furnace body decreases continuously, the flow rate increases. The inner gas passing through the metal mesh dust collector 15 or the centrifugal dust collector 2 is expelled to the air through the bifurcated pipe 9 and the dry pump 10. In order to maintain cleanness and prevent explosions, the dry pump 10 is provided with $N_2$ gas through the pipe 19.

Figure 4:
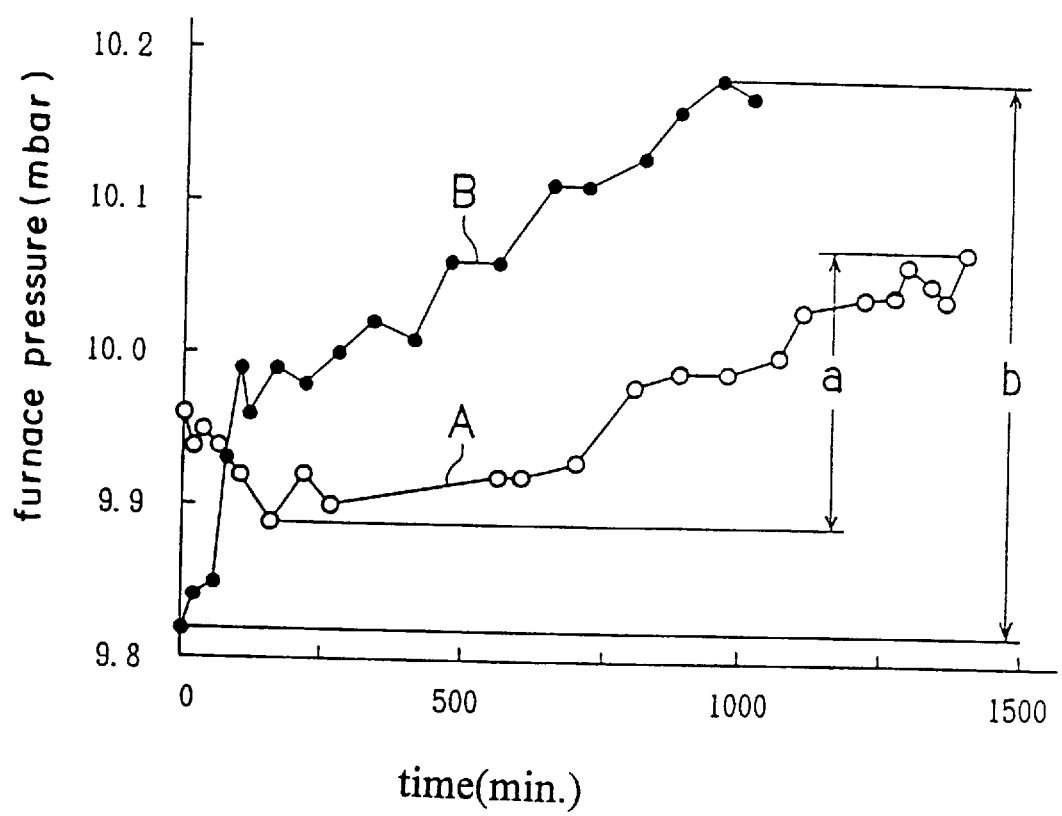
FIG. 4 illustrates a comparison between the time-dependent furnace pressure of a conventional vacuum pump system and that of the present invention.
Figure 5:
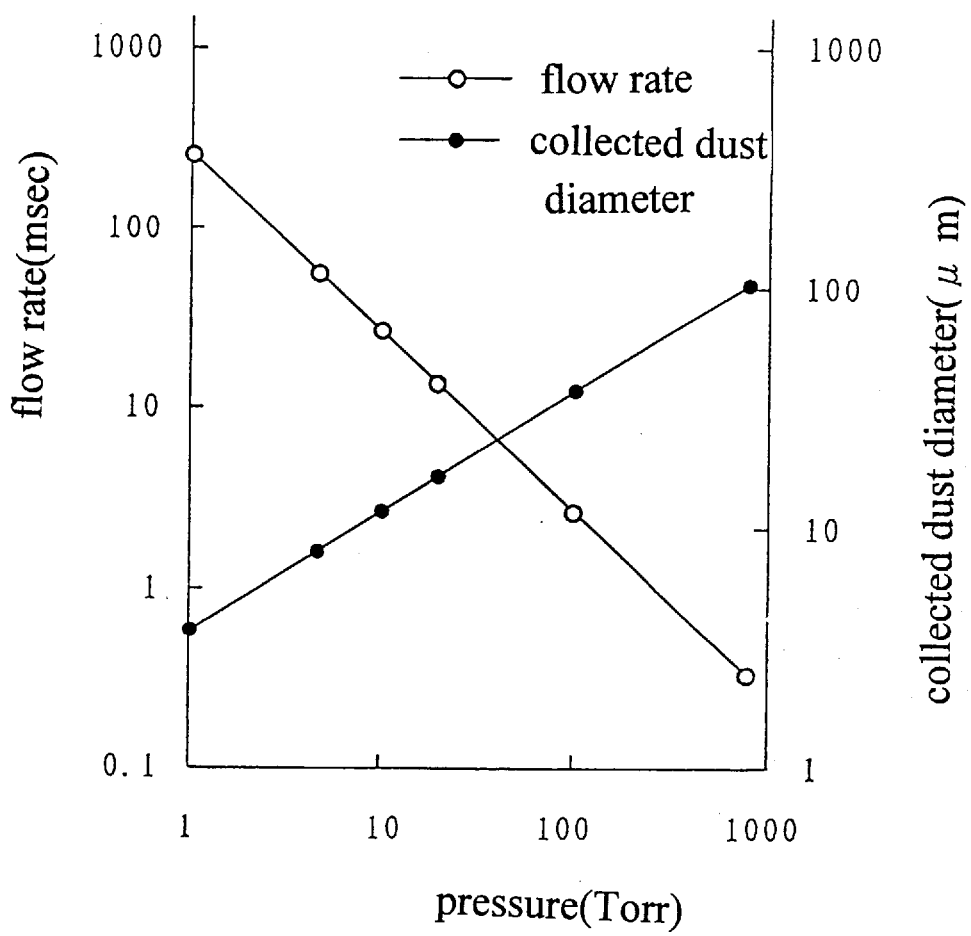
FIG. 5 illustrates the relationships between pressure and flow rate and those between pressure and collected dust diameter in the centrifugal collector.
Figure 6:
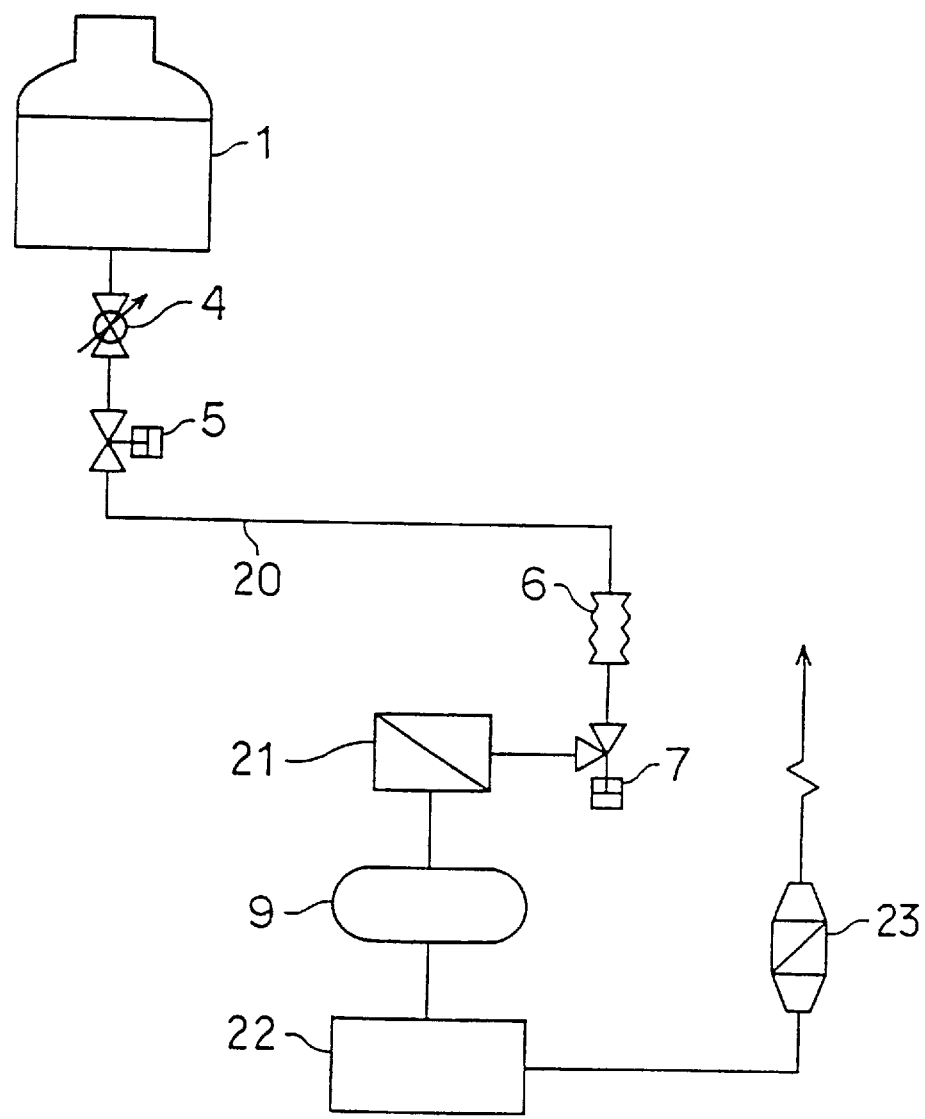
FIG. 6 (Prior Art) illustrates the pipe configuration of a conventional vacuum pump system used in a single-crystal semiconductor pulling apparatus.

The aforementioned centrifugal dust collector has a simple structure and the least pressure loss, as compared with other dust collectors. When the inner gas flows at a rate of 83N l/min, there is only a pressure difference of 2.4 mbar. In the conventional vacuum pump system which utilizes a dust filter, there will be a pressure difference of about 6 mbar under the same conditions. FIG. 4 illustrates the variation of furnace pressure during the pulling process of a single-crystal semiconductor pulling apparatus. The vacuum pump system of the present invention and that of the prior art are both illustrated in the figure for comparison. As compared with the curve B of the prior art system, the pressure variance curve A of the present invention shows an obviously smaller increment in furnace pressure. As shown in the figure, the furnace pressure increment of the vacuum pump system of the present invention is about 50% of the increment b of the prior art system. Moreover, when the single-crystal semiconductor has been pulled for a moment, for example, 1000 hours as shown in FIG. 4, the increment of furnace pressure of the present invention is about 27% of that of the prior art system.

As mentioned above, the present invention is an application of the theory that the gas flow rate in the centrifugal dust collector increases as the vacuum state becomes higher. Therefore, the centrifugal dust collector and the metal mesh dust collector can be provided to connect the closed container and the vacuum pump, thus removing the dust particles by the centrifugal dust collector when the control means detects a pressure in the closed container lower than a predetermined value and controls the valves to switch the dust collector. The present invention is then provided with the following advantages:

1. The flow rate of the gas in the centrifugal dust collector is much higher than that of the normal atmosphere, thus decreasing the critical diameter of the collectable particles and improving the dust collection efficiency.

2. Since the dust collection efficiency increases, much few dust particles will enter the vacuum pump, thus reducing the performance degradation of the vacuum pump and increasing its lifetime.

3. Since the centrifugal dust collector will not be blocked, the pressure in the closed container can be sustained in a predetermined range.

4. Since the centrifugal dust collector is utilized, the maintenance interval can be longer and, since the dust can be easily expelled, the maintenance time can be shortened. Therefore, the single-crystal semiconductor manufacturing efficiency by the CZ method can be improved.

What is claimed is:

1. A vacuum pump system for making a closed container vacuous, comprising a vacuum pump and a centrifugal dust collector provided on a pipe connecting the closed container and the vacuum pump, the pipe including:

a main pipe having a first main pipe which connects the closed container and the centrifugal collector and a second main pipe which connects the centrifugal collector and the vacuum pump;

a bifurcated pipe which is branched out from the first main pipe and connected to the vacuum pump;

a metal mesh dust collector disposed on the bifurcated pipe; and pipe switching means for switching over between the main pipe and a bifurcated pipe.

2. The vacuum pump system as claimed in claim 1, wherein the pipe switching means comprises measuring means for measuring a vacuum of the closed container, and wherein the pipe switching means for switching over in such a manner that the bifurcated pipe is connected with the vacuum pump until the vacuum of the closed container reaches a predetermined value and the main pipe is connected with the vacuum pump after the vacuum of the closed container has reached the predetermined value.

3. The vacuum pump system as claimed in claim 2, wherein the measuring means comprises a vacuum meter having a contact disposed in the closed container, and wherein the pipe switching means further comprises auto valves disposed on the first main pipe at a downstream side of the bifurcated pipe, or on the first main pipe and the bifurcated pipe, respectively, and a control device which outputs a command signal to the auto valves in response to an output signal of the vacuum meter.

4. The vacuum pump system as claimed in claim 3, wherein the closed container constitutes a single crystal pulling apparatus and the centrifugal dust collector is adapted to collect amorphous silicon discharged from the closed container.

5. A method of making a closed container vacuous, comprising:

a first step of making the closed container vacuous through a metal mesh dust collector until a vacuum of the closed container reaches a predetermined value; and a second step of making the closed container vacuous through a centrifugal dust collector so as to form a high vacuum in the closed container whose vacuum has reached the predetermined value.

6. The method as claimed in claim 5, wherein the method is employed in a vacuum exhausting system comprising:

a main pipe including a first main pipe connecting the closed container to be made vacuous and a centrifugal dust collector, and a second main pipe connecting the centrifugal dust collector and a vacuum pump;

a bifurcated pipe branched out from the first main pipe and connected to the vacuum pump; and first and second valves disposed on the first main pipe at a downstream side of the bifurcated pipe, or on the first main pipe and the bifurcated pipe, respectively, and wherein the first step is a step of making the closed container vacuous through the metal mesh dust collector under such a condition that the first main pipe is closed and the second main pipe is opened until a value indicated by the vacuum meter having the contact and disposed in the closed container reaches about 100–200 Torr, and the second step is a step of making the closed container vacuous through the centrifugal dust collector under such a condition that the first main pipe is opened and the second main pipe is closed when the value indicated by the vacuum meter having the contact and disposed in the closed container becomes lower than 100–200 Torr.

* * * * *